United States Patent [19]

Hepp

[11] Patent Number: 5,408,442
[45] Date of Patent: Apr. 18, 1995

[54] HYDROPHONE ELEMENT WITH FILTER CIRCUIT

[75] Inventor: John S. Hepp, Irving, Tex.

[73] Assignee: Whitehall Corporation, Dallas, Tex.

[21] Appl. No.: 126,052

[22] Filed: Sep. 23, 1993

[51] Int. Cl.6 .............................................. H04B 1/06
[52] U.S. Cl. ...................... 367/135; 367/901
[58] Field of Search ................... 367/135, 901

[56] References Cited

U.S. PATENT DOCUMENTS

| | | | |
|---|---|---|---|
| 2,614,143 | 10/1952 | Williams | 327/171 |
| 2,708,742 | 5/1955 | Harris . | |
| 2,782,059 | 2/1957 | Stranberg | 285/247 |
| 2,900,536 | 8/1959 | Palo | 310/9.6 |
| 3,177,016 | 4/1965 | Holmgren | 285/247 |
| 3,258,739 | 6/1966 | Hurley . | |
| 3,333,236 | 7/1967 | Schloss . | |
| 3,418,624 | 12/1968 | Massa . | |
| 3,739,326 | 6/1973 | Kerr et al. . | |
| 3,764,848 | 10/1973 | Berlincourt | 315/55 |
| 3,996,553 | 12/1976 | Siems et al. | 340/15 |
| 4,012,649 | 3/1977 | Cook et al. | 310/8.3 |
| 4,092,629 | 5/1978 | Siems et al. | 340/15 |
| 4,160,229 | 7/1979 | McGough . | |
| 4,204,188 | 5/1980 | Weichart et al. | 367/154 |
| 4,437,689 | 3/1984 | Goebel et al. | 285/246 |
| 4,491,939 | 1/1985 | Carpenter | 367/20 |
| 4,733,379 | 3/1988 | Lapetina et al. | 367/20 |
| 4,736,969 | 4/1988 | Fouts | 285/247 |
| 4,782,470 | 11/1988 | Poturnicki et al. | 367/157 |
| 4,787,069 | 11/1988 | Beauducel et al. | 367/21 |
| 4,819,216 | 4/1989 | Fraioli | 367/154 |
| 4,901,287 | 2/1990 | Hathaway et al. | 367/3 |
| 4,951,265 | 8/1990 | Buckles | 367/18 |
| 5,008,581 | 4/1991 | Kumada et al. | 310/323 |

FOREIGN PATENT DOCUMENTS 2137750 10/1984 United Kingdom ............... 367/20
2145226 3/1985 United Kingdom ............... 367/20

OTHER PUBLICATIONS

Schilling et al., Electronic Circuits, 1979, pp. 355–357.
Profitt, Jack M "A History of Innovation in Marine Seismic Data Acquisition", *Geophysics: The Leading Edge of Exploration*, p. 24 (Mar. 1991).

Primary Examiner—Daniel T. Pihulic
Attorney, Agent, or Firm—Konneker Bush Hitt & Chwang

[57] ABSTRACT

Disclosed are a filtered hydrophone circuit and a method of filtering hydrophone output signals. The circuit, in its most elemental embodiment comprises: (1) a hydrophone having first and second output conductors, the hydrophone producing an electrical signal of varying frequency, (2) an operational amplifier having first and second inputs and an output, the first amplifier input coupled to the first hydrophone output conductor, (3) a first resistor coupling the amplifier output to a second resistor, the second resistor further coupled to an electrical ground and (4) a capacitor coupling the second amplifier input to a point between the first and second resistors to thereby define a feedback path between the amplifier output and the second amplifier input for portions of the hydrophone electrical signal above a selected cutoff frequency, an output signal of the amplifier thereby substantially freed of the portions of the output signal below the selected cutoff frequency.

29 Claims, 5 Drawing Sheets

HYDROPHONE ELEMENT WITH FILTER CIRCUIT

TECHNICAL FIELD OF THE INVENTION

The present invention is directed, in general, to processing of hydrophone-generated signals in towed geophysical streamers and, more specifically, to a hydrophone having a high pass filter, the filter having a stable cutoff frequency.

BACKGROUND OF THE INVENTION

It is now common practice to explore the oceans of the earth for deposits of oil, gas and other valuable minerals by seismic techniques in which an exploration vessel imparts an acoustic wave into the water, typically by use of a compressed air "gun." The acoustic wave travels downwardly into the sea bed and is reflected at the interfaces between layers of materials having varying acoustic impedances. The wave travels back upwardly where it is detected by microphone or "hydrophone" elements in a streamer towed by the vessel to yield information regarding characteristics of the underwater material and structures.

A towed streamer comprises a plurality of pressure-sensitive hydrophone elements enclosed within a waterproof jacket and electrically coupled to recording equipment onboard the vessel. Due to its extreme length (on the order of miles), the streamer is often divided into a number of separate sections or "modules" that can be decoupled from one another and that are individually waterproof. Individual streamers can be towed in parallel through the use of paravanes to create a two dimensional array of hydrophone elements. Data buses running through each of the modules in the streamer carry the signals from the hydrophone elements to the recording equipment (so-called "acoustic data").

In addition to acoustic data, it is also important to collect and transmit data concerning operational status of the array to the vessel (so-called "nonacoustic data"). Nonacoustic data comprises physical characteristics of interest regarding the operation of each module, including whether water has invaded a module in the streamer, module temperature, module depth and power supply voltage.

Each hydrophone element within the streamer is designed to convert the mechanical energy present in pressure variations surrounding the hydrophone element into electrical signals. Most typically, this is done by constructing the hydrophone of a piezoelectric material, such as lead zirconate titanate ("PZT") and a means by which to amplify pressure variations to obtain the strongest possible signal (often by one or more diaphragms acting as tympanic collectors). The hydrophone elements are typically provided with leads or contacts to which to join electrical conductors, the electrical conductors carrying signals from the hydrophone elements to the recording equipment.

During operation, hydrophones encounter acoustic noise produced by a wide variety of sources emanating from the surrounding ocean, such as surface ocean waves striking the streamer or its towing vessel, propeller noise or even volcanos. Thermal variations within the streamer itself of even fractions of a degree can bring about thermal stress in the PZT material of the hydrophone, causing additional noise. The noise these sources produce lies mostly in the range of below 10 Hz, increasing dramatically as the frequency approaches 0 Hz. The valid acoustic signals reflected back from the ocean floor tend to lie in a range from a few Hz to several hundred Hz.

It is desirable to remove very low frequencies because they use available dynamic range yet contribute very little information. This frees the buses of the burden of carrying data pertaining to the frequencies below 10 Hz, allowing the available dynamic range to be spent instead on a higher resolution of the data pertaining to the remaining higher frequencies.

In geophysical applications, it has been common to provide a third order high pass filter having a cutoff frequency in the range of 3 to 10 Hz to attenuate the low frequency noise. The hydrophone's internal capacitance and amplifier input resistance provided the first pole. A second-order filter comprising an operational amplifier having an impedance network associated therewith provided the remaining two poles and further filtered the hydrophone signals. The impedance network comprised a first impedance component coupling an output of the amplifier to a second impedance component, the second component coupled to an electrical ground. An inverted input of the amplifier was coupled to a point between the first and second components, resulting in a feedback loop. The hydrophone was coupled to a non-inverting input on the amplifier. This prior art filtering arrangement will be discussed with reference to a drawing figure thereof in the detailed description to follow.

Unfortunately, this prior art scheme had two significant disadvantages. First, since the scheme relied upon the intrinsic capacitance of the hydrophone itself for the first pole, any variations in that capacitance from one hydrophone to another altered the filter transfer function and hence the characteristics of the filter. Second, impedance variations led to severe channel-to-channel phase mismatch.

Hydrophones are generally optimized for sensitivity and size, not for stable or consistent impedance characteristics. Therefore, such prior art schemes required hydrophones of known and stable impedances. Such hydrophones are commercially available, but are relatively expensive and may sacrifice other performance characteristics to optimize impedance consistency. In the case of multiple hydrophones coupled to a single second-order filter, it was advantageous to impedance-match the hydrophones as a group. This required even more expense, time and effort during manufacture.

Second, and given that the hydrophone/amplifier resistance pole is moved down in frequency and an electronic filter substituted to provide the proper frequency cutoff, the second component (a shunt to ground) was required to be a relatively large capacitor, on the order of 1 to 100 microfarads. Such capacitors have two problems. First, they are relatively large. In a 2 inch diameter streamer, space is at a premium. Therefore, if a large capacitor can be avoided, then the resulting space can be used otherwise. Second, and more critically, such relatively large capacitors tend to be inaccurate. Any inaccuracy in capacitance results in a variation of the filter transfer function, again altering filter characteristics, as in the case with variations in hydrophone impedance.

Thus, the prior art has failed to provide a hydrophone/high-pass filter circuit that has a stable cutoff frequency, accomplished without relying on hydrophone impedance and without employing large, relatively inaccurate shunt capacitors.

SUMMARY OF THE INVENTION

To address the above-discussed deficiencies of the prior art, it is a primary object of the present invention to provide a hydrophone/high-pass filter combination that is stable, even when hydrophone impedance characteristics vary and that employs a smaller, more accurate capacitor than the prior art second-order filter described above.

Accordingly, in the attainment of the primary object, the present invention provides a filtered hydrophone circuit and a method of filtering hydrophone output signals. The circuit, in its most elemental embodiment comprises: (1) a hydrophone having first and second output conductors, the hydrophone producing an electrical signal of varying frequency, (2) an operational amplifier having first and second inputs and an output, the first amplifier input coupled to the first hydrophone output conductor, (3) a first resistor coupling the amplifier output to a second resistor, the second resistor further coupled to an electrical ground and (4) a capacitor coupling the second amplifier input to a point between the first and second resistors to thereby define a feedback path between the amplifier output and the second amplifier input for portions of the hydrophone electrical signal above a selected cutoff frequency, an output signal of the amplifier thereby substantially freed of the portions of the output signal below the selected cutoff frequency.

To accomplish a stable high-pass filter, the present invention preferably uses a noninverting operational amplifier, the first amplifier input being a noninverted input. Thus, in contrast to the prior art, the present invention employs a pole-zero preamp transfer function using components of practical size and high stability. The present invention also lowers the frequency of the pole formed by the hydrophone capacitance and amplifier input resistance.

In a preferred embodiment, a third resistor couples the second amplifier input to the amplifier output, providing an alternative feedback path for the portions of the hydrophone electrical signal. To complete a circuit and a single-ended filter, the second hydrophone output conductor is coupled to the electrical ground. A fourth resistor couples the first amplifier input to the electrical ground.

As previously stated, the present invention avoids the use of a large shunt capacitor by providing instead a smaller capacitor in the feedback between the output and the second input. This allows the capacitor to shrink from more than 1 microfarad to less than 1 microfarad. In fact, in some applications, the capacitor can shrink from 47 microfarads to 10 nanofarads, a more-than-three order change in magnitude. Nanofarad capacitors are quite small, are amenable to surface-mount technology and can be highly accurate and consistent from capacitor to capacitor.

In one embodiment of the present invention, more than one hydrophone is coupled to a given filter. The hydrophones can be coupled in series or in parallel, depending upon design. In one later illustration of an overall system, more than one hydrophone is coupled to a given filter. However, for purposes of simplicity and clarity, only one hydrophone is shown as coupled to a filter in later presented schematics. Those skilled in the art will recognize that the present invention contemplates one or more hydrophones for every filter.

The present invention, as disclosed above, is single-ended. However, the present invention also contemplates a balanced embodiment employing two of the above-described filter circuits. The balanced, filtered hydrophone circuit, comprises: (1) a piezoelectric hydrophone having first and second output conductors, the hydrophone producing an electrical signal of varying frequency, (2) a first noninverting operational amplifier having a first noninverted input, a first inverted input and a first output, the first noninverted input coupled to the first hydrophone output conductor, (3) a first impedance network coupling the first output to the first inverted input and to an electrical ground, the first network including a first capacitor coupling the first output to the first inverted input, (4) a second noninverting operational amplifier having a second noninverted input, a second inverted input and a second output, the second noninverted input coupled to the second hydrophone output conductor, (5) a second impedance network coupling the second output to the second inverted input and to the electrical ground, the second network including a second capacitor coupling the second output to the second inverted input, (6) a third noninverting operational amplifier having a third noninverted input, a third inverted input and a third output, a third impedance network coupling the first output to the third inverted input and to the third output and (7) a fourth impedance network coupling the second output to the third noninverted input and to the electrical ground, an output signal of the third amplifier thereby balanced and substantially freed of the portions of the output signal below the selected cutoff frequency.

The first impedance network further includes a first resistor coupling the first output to a second resistor, the second resistor further coupled to the electrical ground, the first capacitor coupling the first inverted input to a point between the first and second resistors. The second impedance network further includes a third resistor coupling the second output to a fourth resistor, the fourth resistor further coupled to the electrical ground, the second capacitor coupling the second inverted input to a point between the third and fourth resistors.

The third impedance network comprises a fifth resistor coupling the first output to a sixth resistor, the sixth resistor further coupled to the third output, the third inverted input coupled to a point between the fifth and sixth resistors. The fourth impedance network comprises a seventh resistor coupling the second output to an eighth resistor, the eighth resistor further coupled to the electrical ground, the third noninverted input coupled to a point between the seventh and eighth resistors.

Again, ninth and tenth resistors couple the first and second noninverted inputs to the electrical ground.

The foregoing has outlined rather broadly the features and technical advantages of the present invention so that the detailed description of the invention that follows may be better understood. Additional features and advantages of the invention will be described hereinafter which form the subject of the claims of the invention. Those skilled in the art should appreciate that the conception and the specific embodiment disclosed may be readily utilized as a basis for modifying or designing other structures for carrying out the same purposes of the present invention. Those skilled in the art should also realize that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
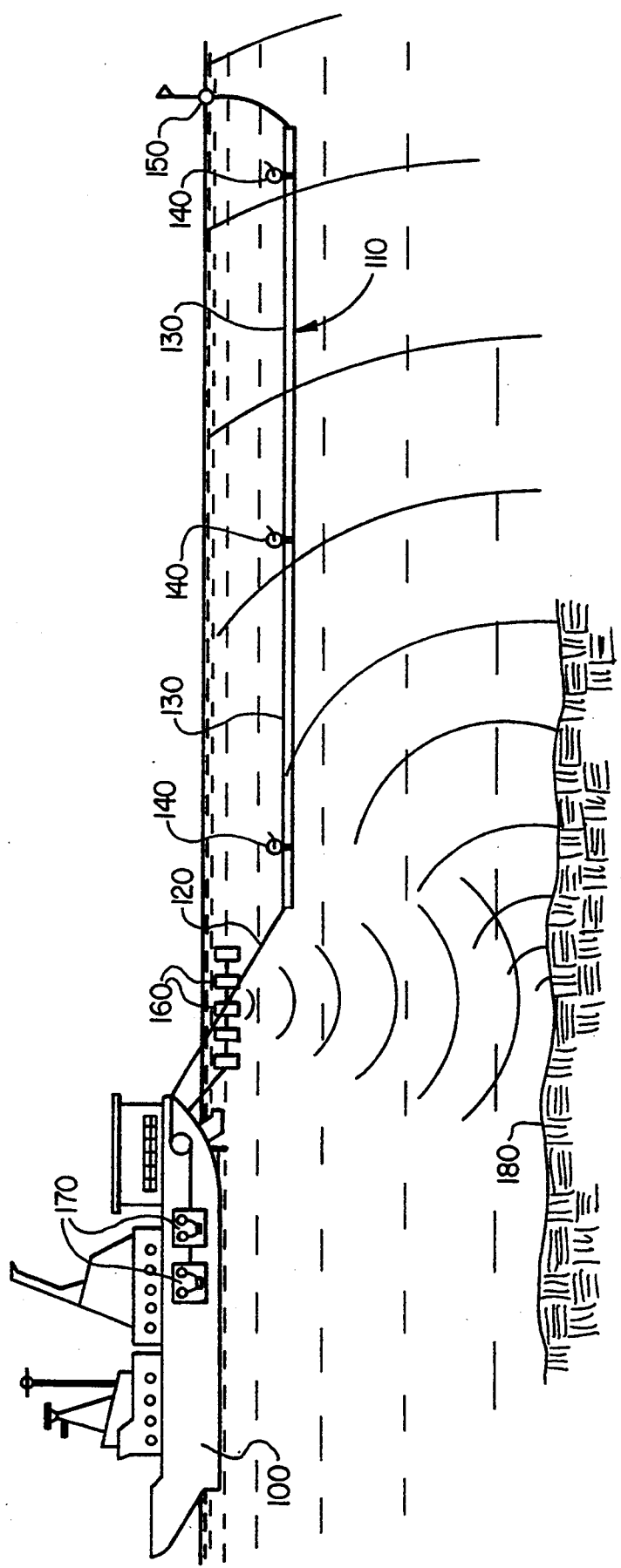
FIG. 1 illustrates an elevational view representing a towed array in operation.

Referring initially to FIG. 1, illustrated is an elevational view representing a towed array in operation. A seismic exploration vehicle 100 tows a streamer cable 110 behind it by way of a tow cable 120. The streamer 110 may comprise a rear buoy 150 if necessary. The streamer 110 is additionally provided with one or more leveling devices or "birds" 140 that serve to regulate the depth of the streamer 110 within the water. The seismic vessel also tows compressed air guns 160 or other sources of acoustic energy that generate an acoustic wave in the water that travels downwardly as shown, reflects at interfaces within the sea bed 180 and is detected by the hydrophones of the streamer 110. As well described in more detail below, the analog signals generated by the hydrophones within the streamer 110 upon receipt of the reflected wave are converted to digital format by analog-to-digital converters also comprised in the streamer 110 and are transmitted in digital form along the streamer 110 and up the tow cable 120 to be recorded by digital recording devices 170 on board the ship 100. The streamer 110 comprises a plurality of modules 130. Each module 130 comprises a plurality of hydrophone assemblies (individually referenced in FIG. 2). The modules 130 are connectible to each other in various numbers to make the streamer 110 any length desired, up to a practical maximum length.

Figure 2:
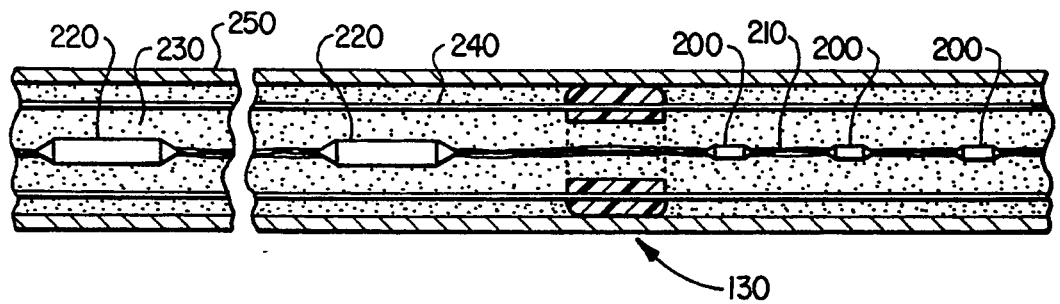
FIG. 2 illustrates a partial cross-sectional view of a typical module 130 of FIG. 1.

Turning now to FIG. 2, illustrated is a partial cross-sectional view of a typical module 130 of FIG. 1. The module 130 comprises a plurality of hydrophone assemblies 200 joined to each other by electrical cables 210. The electrical cables 210 feed into various data processing and transmission units 220 (some of which include the filter of the present invention, as will be detailed) spread along a length of the module 130. An open-cell foam 230 and tensioning wires 240 reside within a waterproof jacket 250. The foam 230 laterally suspends the hydrophone assemblies 200 and the units 220 therein and provides a surface suitable for longitudinally fixing the various units 220 in a relatively stable spaced-apart relationship along the length of the module 130. Maintenance of this spaced-apart relationship of the hydrophone assemblies 200 is important to proper operation of the array because the phase of signals produced by the hydrophone array in response to pressure wave impingement is a function of hydrophone spacing.

The tension cables 240 are used to carry pulling forces generated by the towing vessel and transmitted down the towed array while it is under tow, thereby relieving the cables 210, the jacket 250 and other structures within the jacket 250 from this stress. A fill fluid having a certain desired specific gravity is entrained within the open cell foam 230. This fill fluid is chosen such that, when taken as a whole, the module has a certain desired specific gravity, preferably a neutral buoyancy with respect to sea water so as to minimize effort on the part of the birds to maintain a desired array depth.

Figure 3:
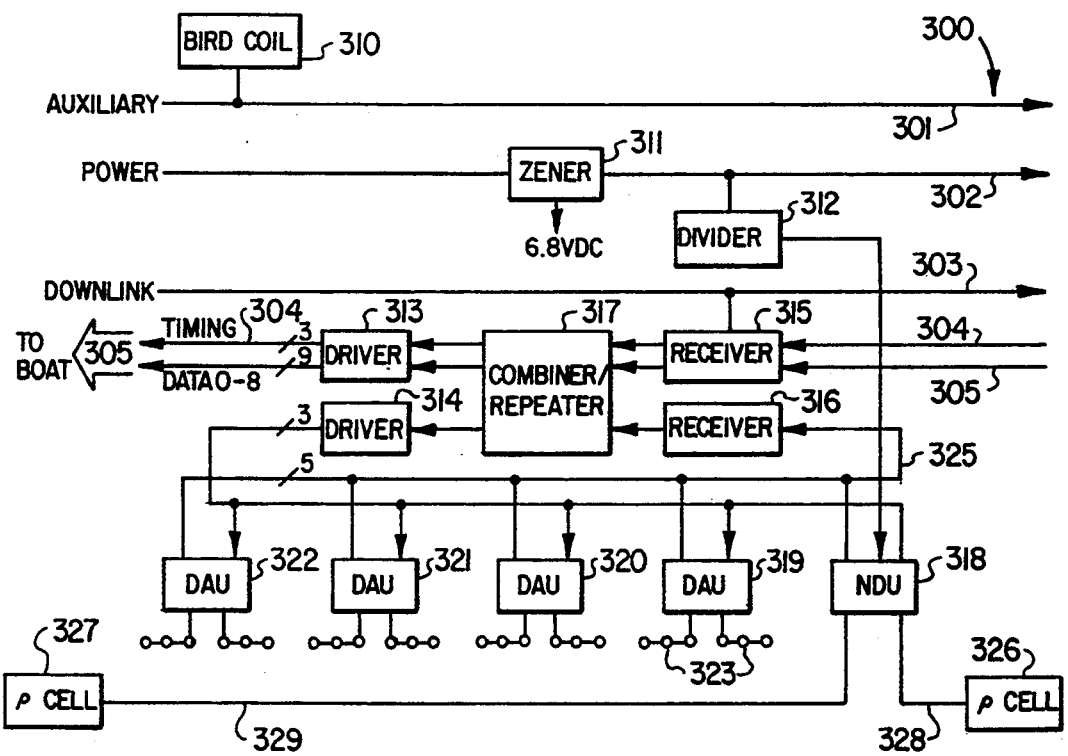
FIG. 3 illustrates a block diagram of an overall digital data system for a towed array that forms the environment for the present invention.

Turning now to FIG. 3, illustrated is a block diagram of an overall digital data system for a towed array module that forms the environment for the present invention. A digital bus 300 is, in a preferred embodiment of the present invention, comprised of twisted-pair wire.

The bus 300 is divided into an auxiliary bus 301, a power bus 302, a downlink bus 303, a timing bus 304 and a combined acoustic/nonacoustic data bus 305. The auxiliary bus 301 is used, among other things to carry signals that are inductively transmitted to one of a plurality of birds (not shown) via a bird coil 310. The power bus 302 carries relatively high voltages (on the order of several hundred volts). A zener diode 311 removes a portion of this voltage in each of the many modules within the array to provide, in a preferred embodiment, 6.8 volts to each module. A divider 312 supplies this voltage to an input on a nonacoustic data unit ("NDU") 318. This allows the NDU 318 to detect whether the module is receiving sufficient power and to transmit an indication of the power level to the seismic exploration vehicle 100 of FIG. 1.

For purposes of the present invention, nonacoustic data is defined as all data other than data acquired through the hydrophones. This includes temperature measurements, depth measurements, voltage measurements or NDU status information. In terms of bandwidth of the total amount of data transmitted, nonacoustic data typically makes up about one percent. Therefore, the majority of data transmitted through the array is acoustic data.

The downlink bus 303 receives downlink commands from the seismic exploration vehicle 100, delivering the downlink commands to various components within the array. The timing bus 304 carries synchronizing clock signals throughout each module in the array to allow the components therein to work in concert. The data bus 305 carries both the acoustic data derived from the hydrophones within the array and the nonacoustic data derived from nonacoustic sensors coupled to the NDU 318 in the form of interleaved packets or frames. Data are arranged within the frames in an order representing the module order within the array.

The timing and data buses 304, 305 enter a receiver 315 where frames thereon (derived from aft modules) are buffered and transmitted therefrom into a telemetry data transmission circuit, called for purposes of this discussion a combiner/repeater unit ("CRU") 317, that serves to combine the data in the frames with local acoustic and nonacoustic data derived from the module shown (and buffered in a receiver 316) into revised frames. These revised frames are transmitted to the next module via a driver 313. The CRU 317 also feeds another driver 314 that serves to coordinate the operation of a plurality of acoustic data acquisition units ("DAUs") 319, 320, 321, 322 via a local timing bus 324. Each of the DAUs 319, 320, 321, 322 communicates with a plurality of hydrophones, representationally referenced as hydrophones 323. Output conductors from groups of the hydrophones 323 are fed into filters (not shown in FIG. 3) within the DAUs 319, 320, 321, 322. In a preferred embodiment of the present invention, the filters provide a balanced output to further acoustic signal processing circuitry within the DAUs 319, 320, 321, 322. The processing circuitry is not shown in FIG. 3 and does not form a part of the present invention. The hydrophone/filter combination of the present invention is designed to free the processing circuitry, the local data bus 325 and the data bus 305 from sacrificing bandwidth by carrying low frequency noise generated during operation of the streamer. The output from the DAUs 319, 320, 321, 322 is fed to the receiver 316 for injection into the data stream of frames on the data bus 305 via a local data bus 325.

Also providing data to the receiver 316 is the NDU 318. The NDU 318 receives timing and downlink commands via the local timing bus 324 and supplies nonacoustic data to the receiver 316 via the local data bus 325. Again, the receiver 316 acts as a buffer for the data prior to entering the CRU 317 for injection into the main data stream. In addition to deriving local module voltage from the divider 312, the NDU 318 detects saltwater invasion via permeability sensors ("Rho cells") 326, 327 via respective lines 328, 329.

Figure 4:
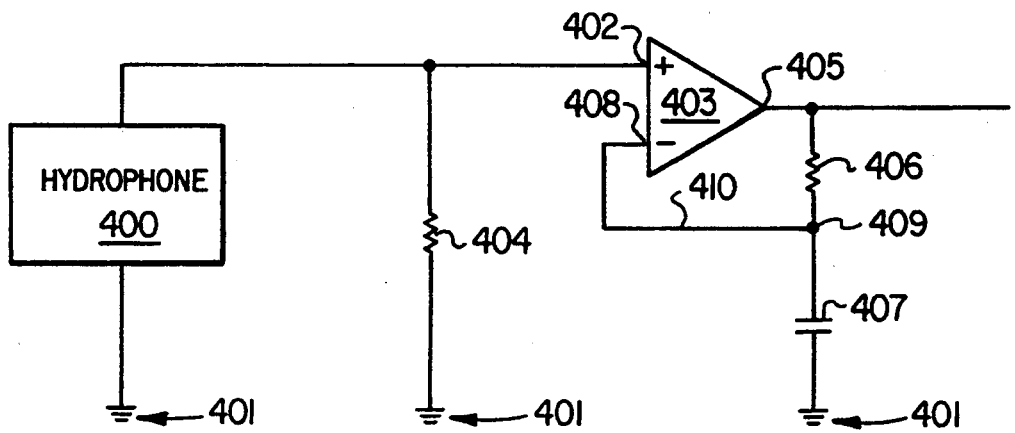
FIG. 4 illustrates a schematic diagram of a prior art third-order hydrophone/filter combination.

Turning now to FIG. 4, illustrated is a schematic of a prior art third-order hydrophone/filter combination previously discussed in the background of the invention. A hydrophone 400 is coupled between an electrical ground 401 and a noninverted input 402 on an operational amplifier 403. A resistor 404 is coupled in parallel with the hydrophone 400. As such, the intrinsic hydrophone impedance itself acts as the first-order filter. Signals produced within the hydrophone are routed through the amplifier 403 and through an output 405 on the amplifier 403. An impedance network associated with the amplifier 403 comprises a first impedance component 406 coupling the output 405 to a second impedance component 407, the second component 407 coupled to the electrical ground 401. An inverted input 408 of the amplifier 403 is coupled to a point 409 between the first and second components 406, 407, resulting in a feedback loop via a conductor 410. The output 405 leads to a conventional second-order high pass filter (not shown). At very low frequencies, the resistor network acts as an open circuit, resulting in unity gain. As frequency rises, gain rises to a practical upper limit.

As previously described, for the prior art filter of FIG. 4 to operate with a low cutoff frequency (around 10 Hz), the second component 407 is required to be a capacitor of substantial size, on the order of 50 microfarads. Capacitors of such size are bulky and imprecise, posing a volume problem in the confines of a 2 inch diameter streamer and deleteriously affecting the filter transfer function (and, hence, the performance of the filter).

Figure 5:
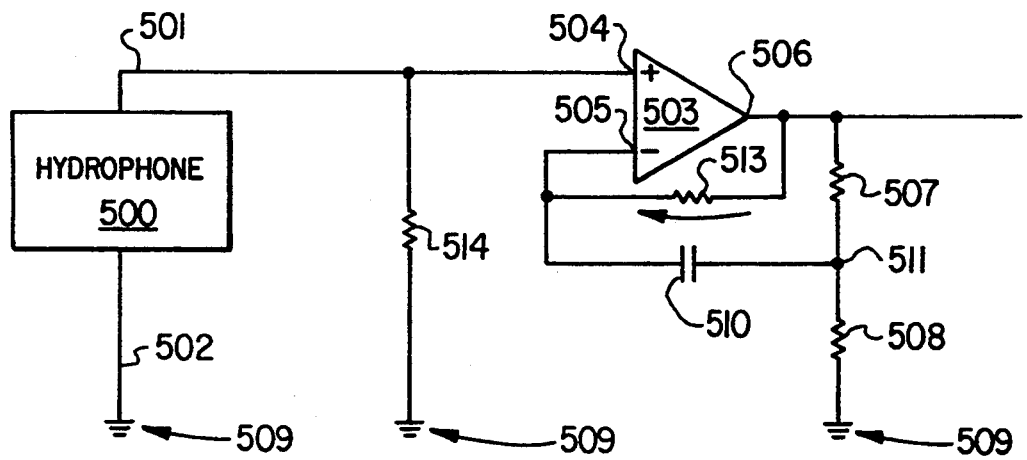
FIG. 5 illustrates a schematic of the hydrophone/filter combination of the present invention employing a single-ended filter and without an associated second-order filter.

Turning now to FIG. 5, illustrated is a schematic of a single-ended embodiment of the hydrophone/filter combination of the present invention. It should be noted that the present invention makes use of a first-order filter because the bandwidth of the transmission circuitry and data buses are such that some low frequency component can be tolerated. Thus, the cutoff frequency does not need to be as sharp.

Shown are a hydrophone 500 having first and second output conductors 501, 502. The hydrophone 500 produces an electrical signal of varying frequency during operation. The electrical signal is a function of pressure placed on the PZT material in the hydrophone 500 and includes undesirable noise produced by a wide variety of environmental and streamer-internal stimuli. Those skilled in the art will realize that the hydrophone 500 may be a single hydrophone or a group of hydrophones coupled together.

An operational amplifier 503 has first and second inputs 504, 505 and an output 506. The first amplifier input 504 is coupled to the first hydrophone output conductor 501. A first resistor 507 couples the amplifier output 506 to a second resistor 508; the second resistor 508 is further coupled to an electrical ground 509. A capacitor 510 is shown as coupling the second amplifier input 505 to a point 511 between the first and second resistors 507, 508 to thereby define a feedback path 512 between the amplifier output 506 and the second amplifier input 505 for portions of the hydrophone electrical signal above a selected cutoff frequency. A third resistor 513 couples the second amplifier input 505 to the amplifier output 506, providing an alternative feedback path for the portions of the hydrophone electrical signal above the selected cutoff frequency. To complete a circuit and a single-ended filter, the second hydrophone output conductor 502 is coupled to the electrical ground 509. A fourth resistor 514 couples the first amplifier input 504 to the electrical ground 509. The output 506 leads to a conventional second-order high pass filter (not shown).

To accomplish a proper high-pass filter with a sharp cutoff, the present invention preferably uses a noninverting operational amplifier. One such commercially-available amplifier is manufactured by Linear Tech, part no. LT1077S8. Other amplifiers are substitutable. The filter transfer function and, hence, the selected cutoff frequency is a function of the values of the first, second and third resistors 507 ("R1"), 508 ("R2"), 513 ("R3") and the capacitor 510 ("C1") and is given by the following:

$$G(s) = \frac{s\tau + 1}{sK\tau + 1}$$

where
$\tau = R1C1$
and $K = R3/(R2+R3)$.

Figure 6:
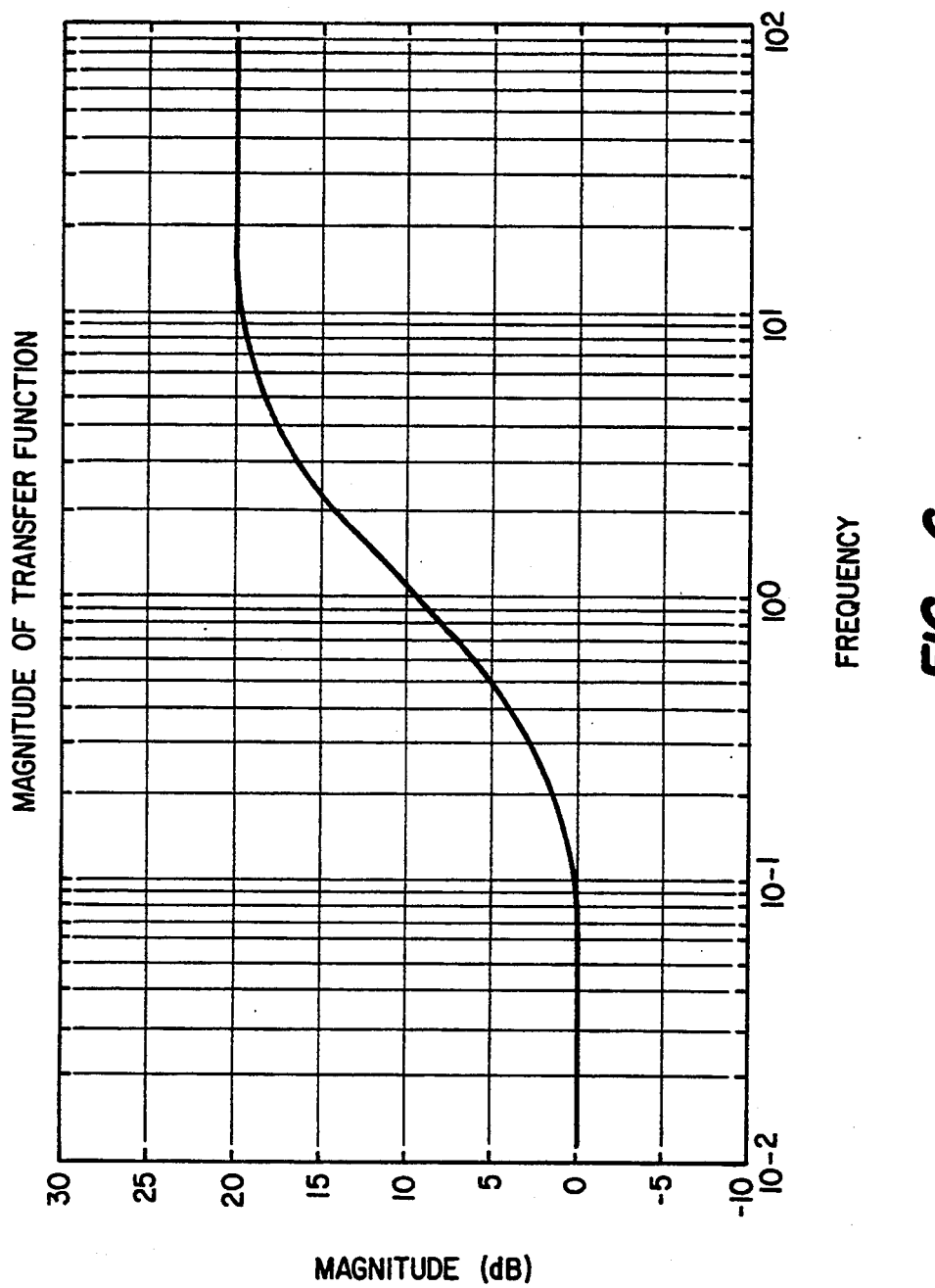
FIG. 6 illustrates a graph of a transfer function for the hydrophone/filter combination of the present invention given certain values for components therein.

In one operable embodiment of the circuit of FIG. 5, the value of the first resistor 507 (R1) is 10.0 KΩ, the second resistor 508 (R2) is 1.1 KΩ, the capacitor 510 (C1) is 47 nF, the third resistor 513 (R3) is 10 MΩ and the fourth resistor 514 is 50 MΩ. The very high input impedance of the amplifier renders the amplifier relatively insensitive to changes in hydrophone impedance, produces a −3 dB cutoff at approximately 3.5 Hz and is desirable for seismic exploration. The normalized magnitude transfer function for the hydrophone/filter combination given these component values is given in the chart of FIG. 6.

As previously stated, the present invention avoids the use of a large shunt capacitor by providing instead a smaller capacitor in the feedback between the output and the second input. This allows the capacitor to shrink from more than 1 microfarad to less than 1 microfarad. In fact, in some applications, the capacitor can shrink from 50 microfarads to as little as 10 nanofarads, a more-than-three order change in magnitude. Nanofarad capacitors are quite small, are amenable to surface-mount technology and are highly accurate and consistent from capacitor to capacitor.

Figure 7:
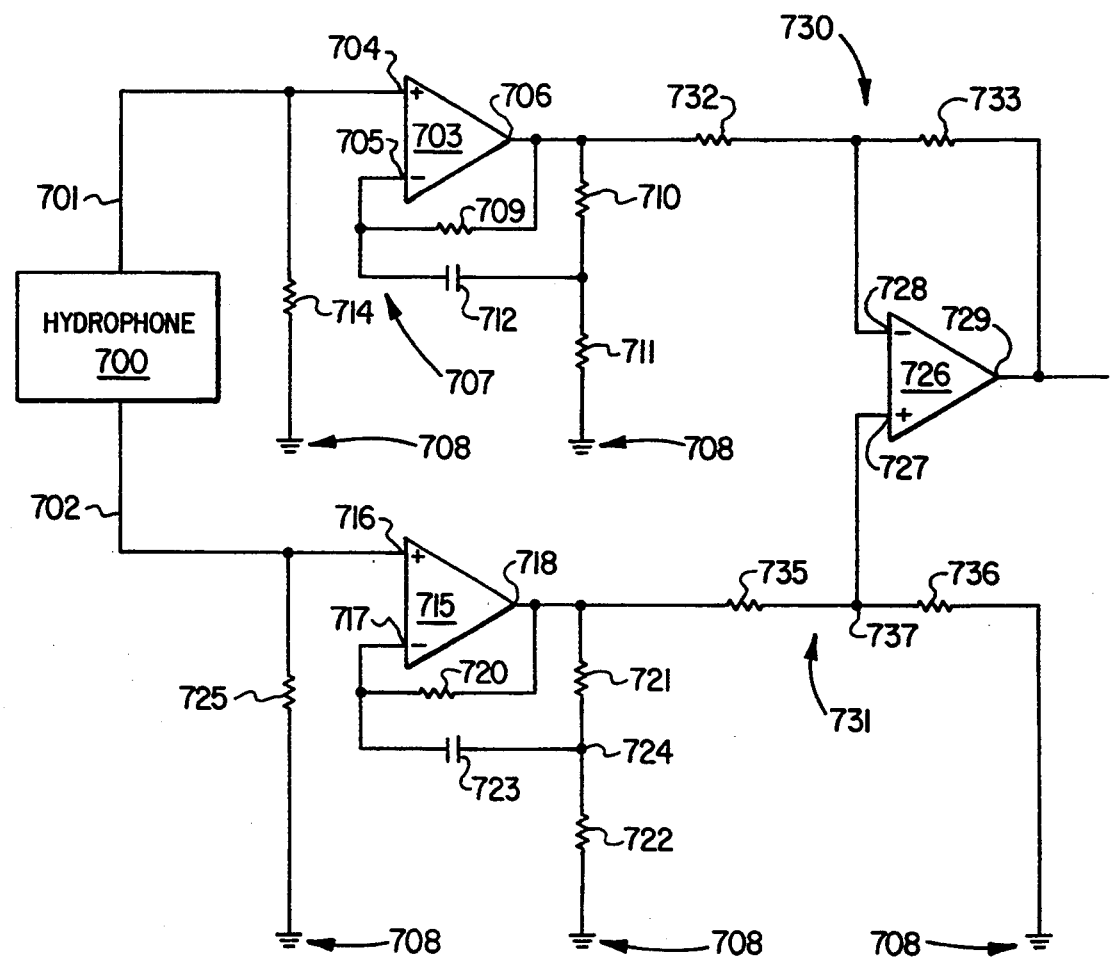
FIG. 7 illustrates a schematic of the hydrophone/filter combination of the present invention employing a balanced-output filter and without an associated second-order filter.

Turning now to FIG. 7, illustrated is a schematic of the hydrophone/filter combination of the present invention employing a balanced-output filter. The balanced, filtered hydrophone circuit, comprises a piezoelectric hydrophone 700 having output conductors 701, 702. Again, those skilled in the art will realize that the hydrophone 700 may be a single hydrophone or a group of hydrophones coupled together.

A noninverting operational amplifier 703 has a noninverted input 704, an inverted input 705 and an output 706, the noninverted input 704 coupled to the hydrophone output conductor 701. An impedance network 707 couples the output 706 to the inverted input 704 and to a ground 708. The network 707 includes a resistor 709 coupling the output 706 to the inverted input 705.

The network 707 further includes a resistor 710 coupling the output 706 to a resistor 711, the resistor 711 further coupled to the ground 708, and a capacitor 712 coupling the inverted input 705 to a point 713 between the resistors 710, 711. Finally, a resistor 714 (not considered to be within the network 707) couples the output conductor 701 to the ground 708.

A noninverting operational amplifier 715 has a noninverted input 716, an inverted input 717 and an output 718, the noninverted input 716 coupled to the hydrophone output conductor 702. An impedance network 719 couples the output 718 to the inverted input 717 and to the ground 708. The network 719 includes a resistor 720 coupling the output 718 to the inverted input 717.

The network 719 further includes a resistor 721 coupling the output 718 to a resistor 722, the resistor 722 further coupled to the ground 708, and a capacitor 723 coupling the inverted input 717 to a point 724 between the resistors 721,722. Finally, a resistor 725 (likewise not considered to be within the network 719) couples the output conductor 702 to the ground 708.

A noninverting operational amplifier 726, acting as a differential amplifier, has a noninverted input 727, an inverted input 728 and a output 729. An impedance network 730 couples the output 706 to the inverted input 728 and to the output 729. Another impedance network 731 couples the output 718 to the noninverted input 727 and to the ground 708. Finally, in a preferred embodiment, the output 729 is coupled to a conventional second-order high pass filter.

The impedance network 730 comprises a resistor 732 coupling the output 706 to a resistor 733, the resistor 733 further coupled to the output 729, the inverted input 728 coupled to a point 734 between the resistors 732, 733. The impedance network 731 comprises a resistor 735 coupling the output 718 to a resistor 736, the resistor 736 further coupled to the ground 708, the noninverted input 727 coupled to a point 737 between the resistors 735, 736.

From the above, it is apparent that the present invention provides a filtered hydrophone circuit comprising: (1) a hydrophone having first and second output conductors, the hydrophone producing an electrical signal of varying frequency, (2) an operational amplifier having first and second inputs and an output, the first amplifier input coupled to the first hydrophone output conductor, (3) a first resistor coupling the amplifier output to a second resistor, the second resistor further coupled to an electrical ground and (4) a capacitor coupling the second amplifier input to a point between the first and second resistors to thereby define a feedback path between the amplifier output and the second amplifier input for portions of the hydrophone electrical signal above a selected cutoff frequency, an output signal of the amplifier thereby substantially freed of the portions of the output signal below the selected cutoff frequency.

Although the present invention and its advantages have been described in detail, it should be understood that various changes, substitutions and alterations can be made herein without departing from the spirit and scope of the invention as defined by the appended claims.

What is claimed is:

1. A filtered hydrophone circuit, comprising:
   a hydrophone having first and second output conductors, said hydrophone producing an electrical signal of varying frequency;
   an operational amplifier having first and second inputs and an output, said first amplifier input coupled to said first hydrophone output conductor;
   a first resistor coupling said amplifier output to a second resistor, said second resistor further coupled to an electrical ground; and
   a capacitor coupling said second amplifier input to a point between said first and second resistors to thereby define a feedback path between said amplifier output and said second amplifier input for portions of said hydrophone electrical signal above a selected cutoff frequency, an output signal of said amplifier thereby substantially freed of said portions of said output signal below said selected cutoff frequency.

2. The circuit as recited in claim 1 wherein said amplifier is a noninverting operational amplifier and said first amplifier input is a noninverted input.

3. The circuit as recited in claim 1 further comprising a third resistor coupling said second amplifier input to said amplifier output.

4. The circuit as recited in claim 1 wherein said second hydrophone output conductor is coupled to said electrical ground.

5. The circuit as recited in claim 1 further comprising a third resistor coupling said first amplifier input to said electrical ground.

6. The circuit as recited in claim 1 wherein said capacitor has a capacitance of less than 1 microfarad.

7. The circuit as recited in claim 1 wherein said second hydrophone output conductor is coupled to a first amplifier input on a second operational amplifier.

8. The circuit as recited in claim 1 wherein said amplifier output is coupled to a first amplifier input on a third operational amplifier.

9. The circuit as recited in claim 1 wherein said second hydrophone output is coupled to a first amplifier input on a second operational amplifier and an output of said second amplifier is coupled to a second amplifier input on a third operational amplifier.

10. The circuit as recited in claim 1 further comprising a plurality of hydrophones coupled to said first amplifier input.

11. A method of filtering hydrophone electrical signals of varying frequencies, comprising the steps of:

transmitting said hydrophone electrical signals into a first amplifier input of an operational amplifier, said operational amplifier producing an output signal that is a function of said hydrophone electrical signals;

directing a portion of said output signal into a second amplifier input of said amplifier via a first resistor and a capacitor coupled in series, said portion representing frequencies of said output signal that are below a selected cutoff frequency; and directing a portion of said output signal into an electrical ground via said first resistor and a second resistor coupled in series, said output signal of said amplifier thereby substantially freed of said portions of said output signal below said selected cutoff frequency.

12. The method as recited in claim 11 wherein said amplifier is a noninverting operational amplifier and said first amplifier input is a noninverted input.

13. The circuit as recited in claim 11 further comprising a resistor coupling said second amplifier input to said amplifier output.

14. The method as recited in claim 11 wherein said second hydrophone output conductor is coupled to said electrical ground.

15. The method as recited in claim 11 further comprising a third resistor coupling said first amplifier input to said electrical ground.

16. The method as recited in claim 11 wherein said capacitor has a capacitance of less than 1 microfarad.

17. The method as recited in claim 11 wherein said second hydrophone output conductor is coupled to a first amplifier input on a second operational amplifier.

18. The method as recited in claim 11 wherein said amplifier output is coupled to a first amplifier input on a third operational amplifier.

19. The method as recited in claim 11 wherein said second hydrophone output is coupled to a first amplifier input on a second operational amplifier and an output of said second amplifier is coupled to a second amplifier input on a third operational amplifier.

20. The method as recited in claim 11 further comprising a plurality of hydrophones coupled to said first amplifier input.

21. A balanced, filtered hydrophone circuit, comprising:

a piezoelectric hydrophone having first and second output conductors, said hydrophone producing an electrical signal of varying frequency;

a first noninverting operational amplifier having a first noninverted input, a first inverted input and a first output, said first noninverted input coupled to said first hydrophone output conductor;

a first impedance network coupling said first output to said first inverted input and to an electrical ground, said first network including a first capacitor coupling said first output to said first inverted input;

a second noninverting operational amplifier having a second noninverted input, a second inverted input and a second output, said second noninverted input coupled to said second hydrophone output conductor;

a second impedance network coupling said second output to said second inverted input and to said electrical ground, said second network including a second capacitor coupling said second output to said second inverted input;

a third noninverting operational amplifier having a third noninverted input, a third inverted input and a third output, a third impedance network coupling said first output to said third inverted input and to said third output; and a fourth impedance network coupling said second output to said third noninverted input and to said electrical ground, an output signal of said third amplifier thereby balanced and substantially freed of said portions of said output signal below a selected cutoff frequency.

22. The circuit as recited in claim 21 wherein said first impedance network further includes a first resistor coupling said first output to a second resistor, said second resistor further coupled to said electrical ground, said first capacitor coupling said first inverted input to a point between said first and second resistors.

23. The circuit as recited in claim 21 wherein said second impedance network further includes a first resistor coupling said second output to a second resistor, said second resistor further coupled to said electrical ground, said second capacitor coupling said second inverted input to a point between said first and second resistors.

24. The circuit as recited in claim 21 wherein said third impedance network comprises a first resistor coupling said first output to a second resistor, said second resistor further coupled to said third output, said third inverted input coupled to a point between said first and second resistors.

25. The circuit as recited in claim 21 wherein said fourth impedance network comprises a first resistor coupling said second output to an second resistor, said second resistor further coupled to said electrical ground, said third noninverted input coupled to a point between said first and second resistors.

26. The circuit as recited in claim 21 further comprising a first resistor coupling said first noninverted input to said electrical ground.

27. The circuit as recited in claim 21 further comprising a first resistor coupling said second noninverted input to said electrical ground.

28. The circuit as recited in claim 21 wherein said first and second capacitors each have a capacitance of less than 1 microfarad.

29. The circuit as recited in claim 21 further comprising a plurality of hydrophones coupled between said first and second noninverted inputs.

* * * * *